United States Patent [19]

Sprintschnik et al.

[11] 4,288,520

[45] Sep. 8, 1981

[54] PROCESS OF MANUFACTURING LIGHT-SENSITIVE COPYING MATERIAL BASED ON DIAZONIUM SALT CONDENSATION PRODUCTS

[75] Inventors: Gerhard Sprintschnik, Hofheim; Fritz Uhlig, Wiesbaden, both of Fed. Rep. of Germany

[73] Assignee: Hoechst Aktiengesellschaft, Fed. Rep. of Germany

[21] Appl. No.: 62,026

[22] Filed: Jul. 30, 1979

[30] Foreign Application Priority Data

Aug. 3, 1978 [DE] Fed. Rep. of Germany ....... 2834059

[51] Int. Cl.³ .................. G03C 1/54; G03C 1/71; G03C 1/74; G03C 1/94
[52] U.S. Cl. .................................. 430/169; 430/168; 430/175; 430/176; 430/302
[58] Field of Search ............... 430/168, 169, 175, 176, 430/302

[56] References Cited

U.S. PATENT DOCUMENTS

| | | | |
|---|---|---|---|
| 2,822,272 | 2/1958 | Kosalek et al. | 430/176 |
| 2,871,119 | 1/1959 | Weegar et al. | 430/175 |
| 3,201,247 | 8/1965 | Leonard | 430/176 |
| 3,298,852 | 1/1967 | Beatty et al. | 430/168 |
| 3,382,069 | 5/1968 | Borchers et al. | 430/302 |
| 3,390,993 | 7/1968 | Borchers et al. | 430/176 |
| 3,396,019 | 8/1968 | Uhlig | 430/175 |
| 3,733,200 | 5/1973 | Takaishi et al. | 430/270 |
| 3,765,894 | 10/1973 | Mellar | 430/274 |
| 3,847,614 | 11/1974 | Mattor | 430/175 |
| 3,996,056 | 12/1976 | Muller | 430/176 |
| 4,092,170 | 5/1978 | Hontermans et al. | 430/175 |
| 4,154,614 | 5/1979 | Tsunoda et al. | 430/308 |
| 4,186,069 | 1/1980 | Muzyczko et al. | 430/169 |

Primary Examiner—Charles L. Bowers, Jr.
Attorney, Agent, or Firm—James E. Bryan

[57] ABSTRACT

This invention relates to a light-sensitive copying material comprising a coating support and an optically homogeneous light-hardenable coating which contains a condensation product of an aromatic diazonium salt and a water-insoluble macromolecular polymer, wherein the coating is applied from a stable dispersion of the water-insoluble polymer under conditions such that after drying an optically homogeneous coating is formed. The invention also relates to a process for the manufacture of a light-sensitive copying material containing the optically homogeneous light-hardenable coating.

6 Claims, No Drawings

PROCESS OF MANUFACTURING LIGHT-SENSITIVE COPYING MATERIAL BASED ON DIAZONIUM SALT CONDENSATION PRODUCTS

The invention relates to a light-sensitive copying material comprising a coating support and a light-hardenable coating which contains a diazonium salt condensation product and a water-insoluble macromolecular polymer, as well as to a process for the manufacture thereof. The copying material is preferentially used for the manufacture of planographic printing and can, after exposure, be developed with pure water.

A copying material of the stated type is known from German Offenlegungsschrift No. 2,626,066. It is manufactured by applying an aqueous dispersion of the water-insoluble polymer, which contains the diazonium salt condensation product, to the coating support, and drying the coating. The resulting coating is composed of a light-sensitive water-soluble phase in which a light-insensitive water-insoluble phase is dispersed. The phase boundaries can be easily discerned under a microscope from the contours of the dispersed particles, which are of the order of magnitude of 1 μm. Development is carried out with pure water, but mechanical assistance by brushing or rubbing is necessary. In the directions for use of a commercial product corresponding to the above application and offered by the applicant of the aforementioned German Offenlegungsschrift, a treatment with a redeveloper is additionally recommended. Development by spraying with water alone is not successful.

Coating mixtures intended for the user to coat printing plate supports himself, and referred to as wipe-on systems, are also commercially available. These again contain mixtures of aqueous polymer emulsions and diazonium salt condensation products and are applied manually to coating supports for planographic printing plates, and then dried. However, the resulting light-sensitive coatings cannot be developed with pure water.

Mixtures of condensation products of diazonium salts and water-soluble polymers, optionally with the addition of water-insoluble polymers, are known for screen printing. These copying coatings contain a large excess of water-soluble polymers and are insufficiently oleophilic for planographic printing.

German Offenlegungsschrift No. 1,447,957 describes a presensitized printing plate which is composed of a silicate-pretreated aluminum support and a light-sensitive coating which is a mixture of a water-insoluble resin which is soluble in organic solvents, and a water-soluble diazonium salt. The coating is applied from organic solvents. The light-sensitivity of such printing plates is relatively low, and the plates do not permit long runs.

A similar material is known from German Offenlegungsschrift No. 2,607,091. There, a coating solution is used which contains a water-insoluble diazo resin and a water-insoluble polymer in an organic solvent, and a water-soluble surface-active agent. The plate is developed with pure water, but the achievable length of run is limited.

It is an object of the invention to provide a negative-working, light-sensitive copying material suitable in particular for the manufacture of printing plates, which is manufactured from aqueous coating mixtures, can be developed cleanly and rapidly, even in fine screen areas, with pure water at room temperature, and gives printing forms capable of long runs.

The invention starts from a light-sensitive copying material comprising a coating support and an optically homogeneous light-hardenable coating which contains a condensation product of an aromatic diazonium salt and a water-insoluble macromolecular polymer.

In the copying material according to the invention, the coating is applied from a stable dispersion of the water-insoluble polymer under such conditions that after drying an optically homogeneous coating is formed.

Optically homogeneous coating is to be understood, within the scope of the present invention, to mean a coating the surface of which appears completely homogeneous under a microscope and does not show any particle structure.

The copying materials according to the invention can be manufactured in a technologically particularly advantageous manner by coating the support with aqueous dispersions without any addition of organic solvents. After imagewise exposure, they can be cleanly developed, even in fine screen areas, by spraying or showering with water without any additive, and give printing forms capable of long runs.

The copying materials can be factory-produced as presensitized printing plates, or can be manufactured by the user himself by applying the coating dispersion to a coating support. They can be used for the manufacture of printing plates, especially of planographic printing plates, but also of relief printing forms, gravure printing forms and screen printing forms, as well as for the production of etch resists, for example for printed circuits.

According to the invention, there is also provided a process for the manufacture of a light-sensitive copying material, in which an aqueous coating mixture which contains a condensation product of an aromatic diazonium salt and a stable dispersion of a water-insoluble macromolecular polymer is applied to a coating support and dried. In this process, the coating mixture is applied, and dried, under such conditions that an optically homogeneous coating is formed.

The light-hardenable coating of the copying material according to the invention contains a condensation product of an aromatic diazonium salt as the light-sensitive substance. Such condensation products are known and are described, for example, in German Pat. No. 1,214,086. They are in general prepared by condensation of a polynuclear aromatic diazonium compound, preferably of substituted or unsubstituted diphenylamine-4-diazonium salts, with active carbonyl compounds, preferably formaldehyde, in a strongly acid medium, preferably concentrated phosphoric acid.

U.S. Pat. Nos. 3,867,147 and 4,021,243, describe further condensation products of this type, which additionally contain units, produced by condensation, which are free from diazonium salt groups and which are preferably derived from aromatic amines, phenols, phenolethers, aromatic thioethers, aromatic hydrocarbons, aromatic heterocyclic compounds or organic acid amides.

Among these diazonium salt condensation products, the water-soluble products are preferred above all; however, the water-insoluble products also can be employed, after conversion to a stable, homogeneous aqueous dispersion.

Suitable water-insoluble polymers are in principle all addition polymers or condensation polymers which can be converted to stable aqueous dispersions. The polymers are employed particularly advantageously in the form in which they emerge from the polymerization of the monomers in aqueous emulsion. Examples of suitable water-insoluble polymers are the homopolymers or copolymers of acrylic acid esters or methacrylic acid esters, for instance the methyl, ethyl, butyl, isobutyl, hexyl, decyl, lauryl, stearyl and cyclohexyl esters, of vinyl esters, such as vinyl acetate, vinyl propionate, vinyl isononanate and vinyl versatate; and of ethylene, dibutyl maleate, styrene, vinyl chloride, vinyl isobutyl ether, isobutylene, butadiene or vinyl butyral. Polyurethane dispersions and Phenodur phenolic resin dispersions are also suitable. Homopolymers or copolymers of alkyl acrylates and alkyl methacrylates with 4 to 12 carbon atoms in the alkyl group, of vinyl alkyl esters with 2 to 12 carbon atoms in the alkyl group, or of dibutyl maleate are preferred, although in the copolymers at least 50 mole percent should consist of units of the aforementioned monomers.

Special comonomers can be used in small amounts in order to impart special properties to the emulsion; examples are ethenesulfonic acid, N-methylolacrylamide and polymerizable "reactive" dyestuffs.

Such polymer dispersions are either commercially available or can be manufactured in accordance with known processes.

The water-wettability and water-developability at room temperature, in the case of many coating mixtures, can be substantially improved by adding surface-active substances (which may be anionic, cationic, nonionic or amphoteric). The most advantageous amount depends in the case of each polymer on the nature of the surface-active substance and in each case can be determined by simple experiments.

Preferably, anionic and nonionic wetting agents are employed. Furthermore, the quality of the coating on the support material is substantially improved by the surface-active substances. Objectionable foaming can be eliminated by means of customary anti-foaming agents.

Examples of suitable surface-active agents are the disodium salt of the sulfosuccinic acid half-ester of a polyethylene glycol monoalkyl ether having a straight-chain alkyl group with 10–12 C atoms or of a polyethylene glycol mononomyl phenol ether, long-chain alkylsulfonates, the sodium salt of the sulfuric acid ester of tris-tert.-butyl-phenol-polyethylene glycol, long-chain alkylphosphoric acid esters, anionically modified polyglycol ethers, fluorine-substituted surfactants, sodium diisobutylnaphthalene sulfonate and sodium lauryl-sulfate.

The copying material according to the invention can also contain protective colloids or thickeners (for example polyvinyl alcohol, polyvinylpyrrolidone, cellulose derivatives, polyvinyl-N-methylacetamide, polyacrylic acid and polyacrylamide). Mixtures of these also can be added. These protective colloids can be added already at the start of the polymerization, or during the preparation of light-sensitive coating mixtures.

According to the invention, preferably water-insoluble polymers with molecular weights of 1,000 to 1,000,000 and having a particle size of about 0.05 μm to 4.5 μm are employed. It is also possible to employ water-soluble synthetic resins which have a transparent appearance (for example ®Resydrol). The coating thicknesses are preferably about 0.1–0.6 g/m². Thicker coatings are possible but do not offer any additional advantages from a copying and printing point of view.

The light-sensitive coating of the copying material according to the invention in general contains from 3 to 70% by weight, preferably from 7.5 to 50% by weight, of diazonium salt condensate, relative to the weight of the non-volatile constituents. It further contains 0.1 to 30, preferably 0.5 to 12, parts by weight of water-insoluble polymer per part by weight of the diazonium salt condensation product. The amount of surface-active agent is 0–5, preferably 0.01–0.6 part by weight and the amount of protective colloid is 0 to 3, preferably 0.01–0.5, part by weight per part by weight of the water-insoluble polymer, over and above the amount which in each particular case is necessary to manufacture and stabilize the polymer dispersion, that is to say, for example, the amount of these constituents which is contained in a commercial dispersion.

Additionally, dyestuffs, plasticizers, indicators and other additives can be incorporated into the copying materials according to the invention. All additives should be selected in such a way that they are compatible with the other constituents of the coating and furthermore absorb as little as possible in the absorption region of the light-sensitive substance.

As a result of the invention, it becomes possible to manufacture copying materials by coating with purely aqueous coating mixtures. The exposed copying materials can be effortlessly developed with pure water, that is to say with water without any additives such as organic solvents, alkalies or salts.

In contrast to the water-developable printing plates described in German Offenlegungsschrift No. 2,626,066, the light-sensitive coatings described here are not heterogeneous but optically homogeneous. Even at 30,000-fold magnification under a scanning electron microscope they show no discrete particles. In contrast, spherical particles can be recognized in the case of the above-mentioned heterogeneous coating already at 1,000-fold magnification.

Compared to these known copying materials, the materials of the invention have a higher resolution and can be developed more rapidly and more easily with water. As a rule, their coating thicknesses are substantially lower and hence the materials have a greater light-sensitivity. The coatings further show an excellent oleophilic character and give long runs in planographic printing. A further advantage is the good resistance to developers, for example to 60% concentration isopropanol, and the hard gradation of the developed printing plates.

To manufacture the light-sensitive copying material according to the invention, the constituents are dissolved or dispersed in water, or previously produced dispersions are diluted with water. The resulting dispersion is applied to a support suitable for reprography, and the applied solution is dried. Coating can be effected by whirler-coating, spraying, dipping or roller application or by means of a liquid curtain, and the method also depends on the properties of the material to be coated. The concentration of dispersed polymer in the coating solution should be in the range from about 0.1 to 20, preferably from 0.5 to 10% by weight. The correct concentration must be determined in each individual case by simple experiments. It must be sufficiently low that the desired coating thicknesses can be achieved with uniform application of the coating, and that the dispersed polymer particles contained in the coating coalesce, on drying under suitable conditions, to give a substantially homogeneous coating. For this purpose, the choice of a suitable drying temperature is important. This temperature is in general in the range between 45° C. and the decomposition temperature of the diazonium compound. Specifically, the temperature depends on the nature of the drying process and on the duration of drying. It should in each case be sufficiently high in order to permit—as stated above—the formation of an optically homogeneous coating.

A great diversity of materials, such as paper, zinc, magnesium, aluminum, chromium, copper, brass, steel and multi-metallic foils or plastic films, are suitable as coating supports. For the manufacture of planographic printing plates, it is preferred to use aluminum which has been roughened mechanically, chemically or by means of an electric current and/or has been anodized, and which advantageously has been pretreated, before sensitization, in known manner with phosphonic acids, especially polyvinylphosphonic acid, or with monomeric or polymeric carboxylic acids.

The addition of dyestuffs or sensitizers to the coating mixture is advantageous in many cases. Examples of suitable dyestuffs are water-soluble dyestuffs, such as rhodamines, sudan blue, methylene blue, eosin or triphenylmethane dyestuffs, such as crystal violet, victoria pure blue, malachite green, methyl violet, fuchsin and colored pigments.

The copying material is exposed in known manner under an original, using copying light sources which emit a very high spectral proportion in the near ultraviolet region. Exposure also can be by means of laser radiation.

Suitable lasers for the irradiation are relatively short-wavelength lasers of the correct output, for examples Ar lasers, krypton ion lasers, helium/cadmium lasers, which emit at approximately between 300 and 600 nm, and, for some coatings, also $CO_2$ lasers which emit at 10.6 $\mu$m or YAG lasers which emit at 1.06 $\mu$m.

The copying materials according to the invention are converted to the ready-to-use printing form in the usual manner. They are—as described above—irradiated with lasers, or exposed under an original. While the coating becomes hardened and substantially insoluble in the areas on which the light acts, the unexposed parts of the coating, which remain soluble, are washed out or removed by dipping and/or by contactless spraying with water. The planographic printing form thus produced, after having been developed, is, if appropriate, inked with a fatty ink and provided with a preservative, such as gum arabic.

Tap water is preferred as the developer. However, small amounts of organic solvents, wetting agents, salts, acids and the like also can be added.

The examples which follow illustrate preferred embodiments of the copying materials according to the invention. Unless stated otherwise, percentages are by weight. One part by weight (PW) is to be taken as 1 g if 1 ml is chosen as one part by volume (PV).

EXAMPLE 1

5 PW of an aqueous 20% concentration emulsion (the emulsifier system being anionic) of polyvinyl acetate, 0.1 PW of a polyethoxylated alkylphenol, 2 PW of a condensation product of 3-methoxy-diphenylamine-4-diazonium salt and formaldehyde, prepared in phosphoric acid and employed as the crude condensation mixture, and 0.1 PW of polyvinyl alcohol were made up to 100 PV with water and the mixture was applied to an anodized aluminum plate, which had been pretreated with polyvinyl phosphonic acid, and was dried for about 2 minutes in a convection oven at 100° C. After imagewise exposure under the UV light source, the plate was rinsed with tap water and inked with a fatty protective ink. On a Multilith-1850 printing machine, the plate gave runs far in excess of 100,000 prints.

EXAMPLE 2

3 PW of an aqueous 20% concentration emulsion of polymethyl methacrylate, the emulsifier system being anionic, 0.5 PW of an anionically modified polyethylene oxide adduct, 0.6 PW of poly-N-vinyl-pyrrolidone, 0.5 PW of the crude condensation product of a diphenylamine-4-diazonium salt and formaldehyde, prepared in concentrated phosphoric acid, 0.25 PW of fuchsin (C.I. 42,510) and 0.2 PW of 85% concentration phosphoric acid were made up to 100 PV with water and the mixture was applied by means of a plate whirler-coater to dry-brushed silicated aluminum. The coating was dried for 2 minutes in a convection oven at 100° C. After imagewise exposure under a UV light source, the plate was clamped in an offset printing machine and developed, in the machine, with pure water. The plate gave several thousand good prints.

EXAMPLE 3

10 PW of a 20% concentration aqueous emulsion of polyvinyl isononanate, prepared using a cationic auxiliary system, 0.5 PW of the polyethoxylated alkylphenol mentioned in Example 1, 2.8 PW of the diazo condensation product mentioned in Example 1, 0.2 PW of a mixed condensation product of 1 mole of 3-methoxy-diphenylamine-4-diazonium salt and 1 mole of 4,4'-bis-methoxymethyl-diphenylether, prepared in 85% concentration phosphoric acid and isolated as the methanesulfonate, were made up to 100 PV with water and the mixture was applied, on a plate whirler-coater, to wet-brushed aluminum which had been pretreated with a mixture of 80% of polyvinyl phosphonic acid and 20% of vinyl phosphonic acid. The coating was dried for about 2 minutes in a convection oven at 100° C. After imagewise exposure, the plate gave many thousands of prints on an offset printing machine.

EXAMPLE 4

80 PW of a 40% concentration polyurethane dispersion, 4 PW of the polyethoxylated alkylphenol mentioned in Example 1, 8 PW of an ammonium alkyl-polyoxyethylene-sulfate (the alkyl group having 18 carbon atoms), 15 PW of the diazo condensation product mentioned in Example 1 and 2 PW of crystal violet (C.I. 42,555) were made up to 300 PV with water and the mixture was applied by means of a Roll-a-coater to an anodized aluminum foil which had been pretreated with $K_2ZrF_6$. The coating thickness after drying was about 0.2 g/m². Drying was carried out as in the preceding examples. After imagewise exposure under a UV light source, the plate was showered with tap water and inked with a fatty protective ink. In an offset printing machine, the plate gave a run of more than 100,000.

EXAMPLE 5

An aluminum plate carrying an anodic oxide layer weighing 1 g/m² was pretreated with 0.5% concentration aqueous polyvinyl phosphonic acid solution at 80° C. for 30 seconds and then coated with a light-sensitive solution of the following composition: 10 PW of a 20% concentration emulsion of polyvinyl versatate, the dispersant being cationic, 1 PW of the polyethoxylated alkylphenol mentioned in Example 1, 0.4 PW of methyl violet (C.I. 42,535) and 0.8 PW of the diazo condensation product mentioned in Example 1, made up to 100 PW with water.

After imagewise to a 25 Watt argon ion laser in the visible region, with a beam velocity of up to about 50 m/s, the parts of the coating not struck by the beam were removed by spraying with tap water. The parts of the coating struck by the beam are hardened and oleophilic, and accept fatty ink when wiped therewith. Thereafter, the plate can be used for printing in an offset printing machine.

EXAMPLE 6

40 PW of a 50% concentration aqueous polyvinyl propionate dispersion and 6 PW of the polyethoxylated alkylphenol mentioned in Example 1 were made up to 1,900 PV with water, while stirring. A solution of 20 PW of the diazo condensation product mentioned in Example 1, in 100 PV of water, is stirred into the foregoing solution. A brass/chromium plate is coated with this mixture on a whirler-coater and the coating is dried for about 2 minutes in a convection oven. After imagewise exposure under a UV source, the plate is sprayed with tap water. Inking the plate with a fatty protective ink presents no problems. Identical results are obtained with an aluminum/copper/chromium multi-metal support.

EXAMPLE 7

5 PW of a 20% concentration polyvinyl isononanate dispersion, prepared using an anionic auxiliary system and polyvinyl alcohol as the protective colloid, 0.1 PW of the polyethoxylated alkylphenol mentioned in Example 1, 2 PW of the diazo condensation product mentioned in Example 1 and 0.5 PW of crystal violet are stirred with about 100 PV of water for some time. A commercial support material for paper offset printing plates is whirler-coated with this solution, and the coating is dried for about 1 minute in a convection oven. After imagewise exposure, and rubbing down with a cotton pad moistened with water, the copying material, without problems, can be inked with a fatty ink and is then ready for the offset printing machine.

EXAMPLE 8

1 PW of a water-insoluble mixed condensation product of 1 mole of 3-methoxy-diphenylamine-4-diazonium salt and 1 mole of 4,4'-bis-methoxymethyl-diphenyl ether, isolated as the mesitylene sulfonate, 4 PW of a triethanolammonium alkylsulfate, 2 PW of a 50% concentration dispersion of a copolymer of vinyl acetate and butyl acrylate, using low-molecular weight hydroxyethyl cellulose as the protective colloid, and 0.3 PW of malachite green (C.I. 42,000) are thoroughly stirred with 100 PV of water until the diazo compound has been homogeneously dispersed. Whirler-coating onto an anodized aluminum support which has been pretreated with polyvinyl phosphonic acid gives a very light-sensitive printing plate which can be developed, without problems, by simple spraying with tap water.

EXAMPLE 9

A mixture of 16 PW of a 53% concentration dispersion of a copolymer of vinyl acetate and dibutyl maleate, 0.1 PW of the polyethoxylated alkylphenol mentioned in Example 1, 0.1 PW of malachite green (C.I. No. 43,000), 0.4 PW of a 40% concentration dispersion of a green copper phthalocyanine pigment (C.I. 74,260), 0.6 PW of a 30% concentration aqueous solution of the anionic wetting agent mentioned in Example 4, 1 PW of the diazo condensation product mentioned in Example 1 and 100 PV of water was applied, on a whirler-coater, to wire-brushed aluminum (pretreated with polyvinyl phosphonic acid). After imagewise exposure, the plate can be developed with water. The plate gave several thousand good prints.

EXAMPLE 10

160 PW of a 22% concentration polyvinyl versatate dispersion, the emulsifier system being anionic (a long-chain alkylsulfonate), 36 PW of the anionic wetting agent mentioned in Example 4 (a 30% concentration solution in water), 10 PW of a malachite green (C.I. 42,000), 12 PW of 85% concentration phosphoric acid and 40 PW of the diazonium salt mixed condensation product mentioned in Example 3 were made up to 4,000 PV with water and dry-brushed aluminum (pretreated with polyvinyl phosphonic acid) was coated therewith on a machine. Plates, having a coating thickness of 0.4 g/m², showed excellent light-sensitivity and could be developed, after imagewise exposure, with water to which 0.03% of a Na-alkylsulfonate ($C_{16-18}$) had been added. Such a plate showed good oleophilic character and gave several thousand prints in an offset machine.

It will be obvious to those skilled in the art that many modifications may be made within the scope of the present invention without departing from the spirit thereof, and the invention includes all such modifications.

What is claimed is:

1. In a process for the manufacture of a negative-working, presensitized planographic printing plate developable in pure water at room temperature by applying an aqueous coating mixture without any addition of organic solvent to an aluminum plate support and drying the coating, said coating mixture containing
    (a) a water-soluble light-sensitive condensation product of an aromatic diazonium salt,
    (b) a stable dispersion of a water-insoluble macromolecular polymer, and
    (c) about 0.01 to 0.6 part by weight of a surface-active agent per part by weight of the water-insoluble polymer, over and above the amount of surface-active agent required to manufacture and stabilize the dispersion, the improvement which comprises drying the coating mixture at a temperature between about 45° C. and the decomposition temperature of the diazonium compound and under conditions such that an optically homogeneous light-hardenable coating with no discrete particles visible at 30,000-fold magnification is formed.

2. A process as claimed in claim 1 wherein the coating mixture contains about 0.1 to 30 parts by weight of water-insoluble macromolecular polymer per part by weight of the diazonium salt condensation product.

3. A process as claimed in claim 1 wherein the coating mixture contains about 0.01 to 0.5 part by weight of a protective colloid per part by weight of the water-insoluble polymer, over and above the amount of protective colloid which may be required to manufacture and stabilize the dispersion.

4. A process as claimed in claim 1 wherein the coating mixture contains about 3 to 70 percent by weight, relative to the non-volatile constituents of the mixture, of a diazonium salt condensation product.

5. A process as claimed in claim 2 wherein the water-insoluble polymer is a homopolymer or copolymer of an alkyl acrylate or alkyl methacrylate with 4 to 12 carbon atoms in the alkyl group, or of a vinyl ester, or is a copolymer of dibutyl maleate.

6. A process as claimed in claim 1 wherein the surface-active agent is an anionic or nonionic surface-active agent.

* * * * *